United States Patent [19]

Endo

[11] 3,775,725

[45] Nov. 27, 1973

[54] PRINTED RESISTOR

[75] Inventor: Isunehiko Endo, Tokyo, Japan

[73] Assignee: Hokuriku Electric Industry Co., Ltd., Kaminiikawa-gun, Toyama-Prefecture, Japan

[22] Filed: Jan. 24, 1972

[21] Appl. No.: 220,094

Related U.S. Application Data

[63] Continuation-in-part of Ser. No. 33,438, April 30, 1970, Pat. No. 3,648,364.

[52] U.S. Cl. ............. 338/262, 317/101 C, 338/254, 338/307, 338/308, 338/312

[51] Int. Cl. ............................................. H01c 1/14

[58] Field of Search ................. 317/101 C; 338/307, 338/308, 254, 262, 276, 312, 325; 174/68.5

[56] References Cited

UNITED STATES PATENTS

| | | | |
|---|---|---|---|
| 3,061,911 | 11/1962 | Baker | 338/307 |
| 3,411,122 | 11/1968 | Schiller | 338/308 |
| 3,308,528 | 3/1967 | Bullard | 338/262 |
| 3,372,309 | 3/1968 | Stockdale | 174/68.5 |
| 3,487,268 | 12/1969 | Laungdell | 338/308 |
| 3,321,570 | 4/1967 | Webb | 174/68.5 |

*Primary Examiner*—E. A. Goldberg
*Attorney*—George V. Woodling et al.

[57] ABSTRACT

A printed resistor comprising an insulating matrix board, copper layers printed on one side of said board by etching and having predetermined patterns, impedance layers screen-printed on the other side of said board, and conductors applied in holes formed in said board and extending through said holes for electrically connecting between selected ones of said copper layers and said impedance layers.

7 Claims, 7 Drawing Figures

PATENTED NOV 27 1973

3,775,725

PRINTED RESISTOR

REFERENCE TO RELATED APPLICATION

This is a Continuation-In-Part of my application Ser. No. 33,438 filed Apr. 30, 1970, entitled "Method of Making A Printed Resistor", now. U.S. Pat. No. 3,648,364 issued March 14, 1972.

BACKGROUND OF THE INVENTION

For assembling electronic appliances such as radio sets and television sets, for example, into a compact construction, electric resistors, electric condensers or semi-conductors such as transistors are generally attached to a printed circuit board. However, hithertofore, the resistors, condensers or semi-conductors have been individually fabricated as independent units and then attached to the printed circuit board by extending the leads of the resistors, condensers or semiconductors through holes in the board for connecting the leads to copper layers on the board by soldering. When the above-mentioned electric appliances are produced in the manner mentioned just above, it is necessary that such devices be attached to the board extending upwardly on the surface of the board by a substantial height, and accordingly, such electric devices are installed occupying a substantial area which imposes restriction on the reduction of the size of such appliances. And generally, installing and soldering such devices on the board requires a substantially long time interval.

SUMMARY OF THE INVENTION

This invention relates to an electric resistor and more particularly, to an electric resistor which is suitably attached to the printed circuit board for various types of electronic appliances.

one principal object of the present invention is to provide a process for producing a printed resistor which makes it possible to reduce the size of an electronic appliance in conjunction with which said resistor is employed and which can be attached to the printed board of the electronic appliance at a height as low as possible from the surface of the board.

For achieving this object of the present invention, the board may be designed to have any other electronic component or components disposed over the printed resistor.

A further object of the present invention is to provide a printed resistor produced by the process as mentioned above.

According to one aspect of the present invention, there is provided a process for producing a printed resistor which comprises the steps of applying copper patterns on a first side of an insulating board by etching so as to form copper layers thereon; forming pairs of aligned through holes in said board and copper layers at points where electrical devices are to be connected; applying a pair of electrical conductors in each of said through holes; and applying imedpance material on a second side of said board by printing so as to form layers of impedance material across each pair of said electrical conductors.

According to another aspect of the present invention, there is provided a printed resistor employing a printed circuit board which comprises an insulating board, copper layers prnted on a first side of said board by etching and having predetermined patterns, impedance layers printed on a second side of said board at predetermined regions thereon, and conductors applied in holes in said board for electrically connecting between selected ones of said copper layers and said impedance layers.

The above and other objects and attendant advantages of the present invention will be more apparent to those skilled in the art from a reading of the following detailed description in conjunction with the accompanying drawing in which one preferred embodiment of electricalprinted resistor according to the present invention is illustrated.

PREFERRED EMBODIMENT OF THE INVENTION

Figure 1:
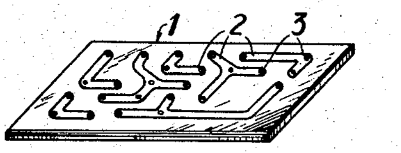
FIG. 1 is a perspective view of a printed circuit board employed in the production of an electric printed resistor according to the present invention showing the side which bears copper patterns thereon.

The present invention will now be described referring to the accompanying drawing and more particularly, to FIGS. 1 and 2 thereof. In these figures, a printed circuit board on which a printed resistor is to be provided is generally indicated by reference numeral 1. The printed circuit board 1 has various components (not shown), such as capacitors, transistors, diodes and the like, necessary for assembly of an electronic apparatus, such as radio and television sets, for example, hardwired by any suitable means, such as soldering through copper layers described hereinbelow to each other and/or to the printed resistors of the present invention. In the production of an electric printed resistor using the printed circuit board 1 as its matrix body a board formed of a suitable insulating material is formed on one side with copper layers 2 having predetermined patterns by etching away undesired portions of the copper and the board is suitably provided adjacent to the opposite ends of each of said copper layers thereof with through holes 3 also extending the full depth or height of the copper layer.

The thus treated board is then formed on the other side with resin coatings 4 at selected or predetermined areas thereof by screen-printing where a resistor is to be applied in the manner which will be described hereinafter. The resin coatings 4 are adapted to eliminate effects upon impedance elements to be formed on the board on the above-mentioned other side depending upon the material of which the board is formed and serve as damp-proofing base layers for the impedance elements. The resin coatings 4 may be formed of a solvent dispersed resin comprising epoxy resin, xylene resin, phenolic resin and melamine resin dispersed in a suitable solvent. The thus printed and coated board is left to dry at the ambient temperature and then subjected to heat-treatment at 100°C – 150°C for about 30 minutes so that the resin layers 4 will be baked. The resin layers may be eliminated in some cases wherein the board has a smooth surface.

Thereafter, the walls defining the holes 3 in selected ones of the copper layer 2 are applied with electrically conductive coatings 5 thereon. Each of the electrically conductive coatings 5 can be applied on the hole defining walls by inserting a small diameter pin on which the conductive coating material is deposited into the hole and then withdrawing the pin out of the hole. The electric conductive layer 5 extends over the adjacent copper layer 2 at one end of the associated hole 3 and over the adjacent resin layer 4 at the other end of the same hole. The electrically conductive coatings 5 comprise a resin dispersion in which a mixture of silver powder and resin such as epoxy resin or phenolic resin is dispersed in a suitable solvent. The electrically conductive layers 5 are then left to dry at the ambient temperature. Conductors which will extend through the electrically conductive coating-applied holes 3 may be in the form of conductive rods which will extend through the holes. The copper layer side of the printed board is then applied with second electrically conductive coatings 6 thereon by screen-printing at areas where the first electrically conductive coatings 5 are electrically connected to the copper layers 2. The second conductive coatings 6 may be formed of the same material as that of the first conductive coatings 5 and are also left to dry at the ambient temperature. Insulating resin coatings 7 are screen-printed on the exposed side of the second conductive coatings 6 so as to protect the second conductive coatings from the atmosphere. The protective coatings 7 may be formed of the same material as that of the insulating resin coatings 4 and are dried at 100°C – 150°C for about 30 minutes.

Thereafter, impedance elements 8 having different resistance values are applied on the exposed side of the insulating resin coatings 4 by screen-printing and te impedance elements may be in the form of a solvent dispersed resin in which a mixture of resin such as epoxy resin or phenolic resin and carbon black or graphite powder are dispersed in a suitable solvent. The resistance values of the impedance elements 8 may be varied within a wide range by suitably selecting the width and length of the impedance elements. Therefore, when a plurality of resistors having different resistance values are applied on one piece of board, the resistors are applied in suitable patterns depending upone length and width of these elements. In some case, even if the patterns for the impedance elements are predetermined, desired resistances cannot be obtained for the impedance elements of different resistance values by only one screen-printing operation. In such a case, the impedance elements are grouped into a plurality of groups with each group comprising impedance elements which have approximatelg similar resistance values and the different groups of impedance elements are applied one group after another using materials having different resistance values and masks having different patterns, respectively for the different groups at different times. The thus applied impedance elements 8 are dried at 100°C – 130°C for 40 to 50 minutes.

After the application of the impedance elements, the printed board is applied thereon with electrically conductive coatings 9 between both the ends of the impedance elements 8 and the ends of the conductive coatings adjacent to the impedance elements so that the ends of the impedance elements 8 will be positively electrically connected to the adjacent ends of the electrically conductive coatings 5. The conductive coatings 9 are applied by screen printing in the same manner as that in which the electrically conductive coatings 6 are applied and dried at 100°C – 150°C for about 30 minutes.

Both the layers of the impedance elements 8 and those of the conductive coatings 9 are simultaneously set and baked. The baking temperature and time interval should be such that the board can withstand the heat treatment without being affected thereby. If desired, the layers of the impedance elements 8 and conductive coatings 9 may be heat-aged.

The thus obtained electrical printed resistors are then determined for their resistance values and any resistors the resistances of which are out of perdetermined values are adjusted until the resistance values will reach predetermined desired levels. That is, when it has been found that the resistance values are lower than their respectively desired values, the resistance adjustment of the impedance elements is effected by reducing the width of the elements by knife-cutting, for example, until they have their desired resistances. When it has been found that the element 8 has a resistance higher than its desired resistance, the desired resistance can be obtained by applying a silver coating on the one end or the opposite ends of the element so as to reduce the effective length of the element.

Finally, an insulating resin coating 10 is applied over the impedance elements 8 and conductive coatings 9 by printing and then dried so that the impedance elements will be protected from the atmosphere. the protective coating 10 also serves as a mechanical shield which protects the impedance element 8 and conductive coatings from moisture and external impact. the protective coating 10 should be formed of a suitable material which will not cause the resistance values of the impedance elements to vary. Typically, the protective coating 10 is formed of the same material as that of the resin or base coatings 4. The protective coating 10 may be also eliminated if any protective shell is provided.

According to one specific embodiment of the present invention, the board comprises a laminated paper base in which phenol resin is impregnated. The board is formed on one side with copper layers having desired patterns by etching. The patterns of the copper layers are so selected that they can be suitably employed for wiring electrical condensers, resistors and transistors which are essential components in radio and television sets. The board has been previously formed with through holes 3 which will communicate with the holes of the copper layers 2.

The board is then formed on the opposite side with base coatings having desired different patterns by screen printing with the aid of nylon screen masks of 200 mesh having predetermined lengths and widths. The base coatings are applied on the board side at areas where impedance elements will be applied in the latter stage of the process. The base coatings are formed by the use of a solvent dispersed resin comprising a solvent containing epoxy resin dispersed therein and having the poise of about 2 × 105. The thus applied base coatings are then left to dry at the ambient temperature for about 30 minutes and then baked at 130°C for about 30 minutes to set them. It has been found that the thickness of the obtained base coatings is about 30$\mu$.

Then, to the walls defining selected ones of the through holes in the board there is applied silver coating thereon and the silver employed is a commercially available silver diluted with toluene. The silver base coating material is first deposited at the point of a pin and the pin is inserted through each of the selected holes from one end of the hole so as to deposit the coating material on the wall defining the hole. Thereafter, the pin is withdrawn out of the hole. The thus applied coatings are left to dry at the ambient temperature for about 30 minutes. After the drying of the silver base coatings, second silver coatings are applied across the opposite ends of copper layers and base coatings by screen-printing. The material of the second silver coatings is of the same type as that of the first-mentioned silver coatings applied on the hole walls. The second silver coatings are dried by heating them at about 130°C for about 30 minutes. Furthermore, epoxy resin coatings of the same material as that of the base coatings are applied by screen-printing over the silver coatings and their adjacent areas and the epoxy resin coatings are left to dry at the ambient temperature for about 30 minutes followed by baking at 130°C for 30 minutes.

The material employed for the impedance element applying operation is a mixture of xylene resin and acetylene black dispersed in a solvent such as methyl carbitole acetate and having the viscosity of 100,000 poise. The relationship between the blending ratio of the importance element forming material and the area resistance value of the material when applied in the form of film or coating layer is as follows:

| Area Resistance Value | Blending Ratio (part by Weight) Xylene resin | Solvent (methyl carbitole acetate | Acetylene black |
|---|---|---|---|
| 1 kΩ/sq | 100 | 100 | 23 |
| 10 kΩ/sq | 100 | 75 | 10 |

The above-mentioned impedance element forming material is applied on the board at selected areas thereon by screen-printing so that the impedance elements formed by the material may have desired different area resistances and the thus obtained impedance elements are dried by heating them at about 130°C for 45 minutes. It has been found that the thus dried impedance elements have the thickness of about 15$\mu$. Thereafter, silver coatings are applied across the opposite ends of layers of the impedance elements and the adjacent ends of the conductive coatings extending through the holes in the board and copper layers and the silver coatings are dried by heating them at about 130°C for 30 minutes.

Both the impedance elements and conductive layers are then baked at 160°C for about 60 minutes and are left at 100°C for 15 hours. The thus obtained printed resistor is determined for any deviation from desired patterns with the eye and also determined for its resistance value. And the pattern deviation and resistance values are, if any, adjusted as desired.

Thereafter, an epoxy resin coating is applied over the impedance elements and conductive layers and left to dry at the ambient temperature for 30 minutes followed by backing at about 130°C for 30 minutes.

Figure 2:
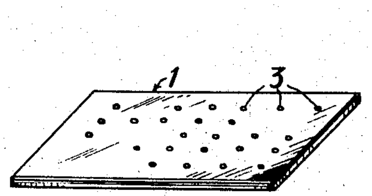
FIG. 2 is a perspective view of said printed circuit board of FIG. 1 showing the opposite side or the side which bears no copper patterns.
Figure 4:
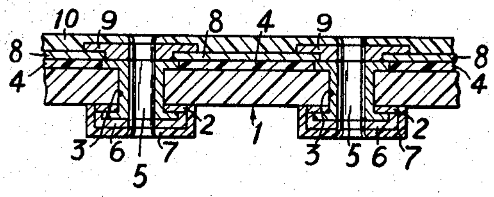
Figure 3:
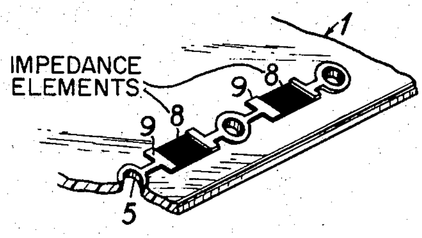
FIG. 3 is a fragmentary perspective view of said printed circuit board having impedance elements printed on said opposite side and electrically connected to the copper layers on said copper pattern-bearing side; and, FIG. 4 is a vertically sectional view on an enlarged scale of a portion of a printed resistor provided on said printed circuit board constructed in accordance with the present invention.
Figure 5:
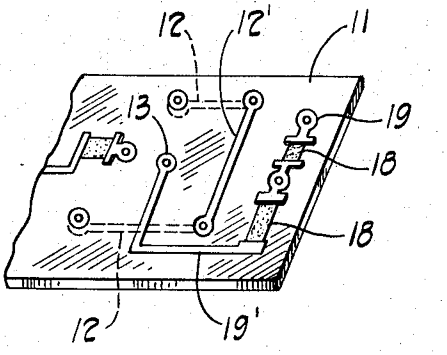
FIG. 5 is a fragmentary perspective view of the printed circuit formed in accordance with a second embodiment of this invention.

Referring to FIG. 5, there is shown another form of printed circuit board 11 on one side of which is applied conductive layers 12 which are like the conductor layers 2 of FIGS. 1 and 4, and which constitute a substantial portion of a wiring layer whereas the other side of the board are aplied thereon impedance layers 18 connected to preselected layers 12. Numeral 12' denotes a jumping conductor provided on the side of the board on which the impedance layers 18 are applied and the jumping conductor is adapted to connect the two other selected ones of the conductive layers 12 so as to complete the wiring. As in the case of the layers 12, the conductive layer or jumping conductor 12' may be formed by etching away unnecessary portions of the copper foil applied on the board or formed by a silver coating which was formed together with silver coatings 19, similar to coatings 9 of FIGS. 1 and 4, on the ends of the impedance layers. In either case, the jumping layer 12' and conductive layers 12 are connected to each other in the same manner as that in which the impedance layer 8 and copper layer 2 are connected to each other as shown in FIGS. 1–4. One end of one of the impedance layers 18 shown in FIG. 5 has a silver coating 19' extending by a substantial distance therefrom and the silver coating 19' is passed through a through hole 13 remote from the particular impedance layer to be connected to one of the copper layers 12.

Figures 6A, 6B:
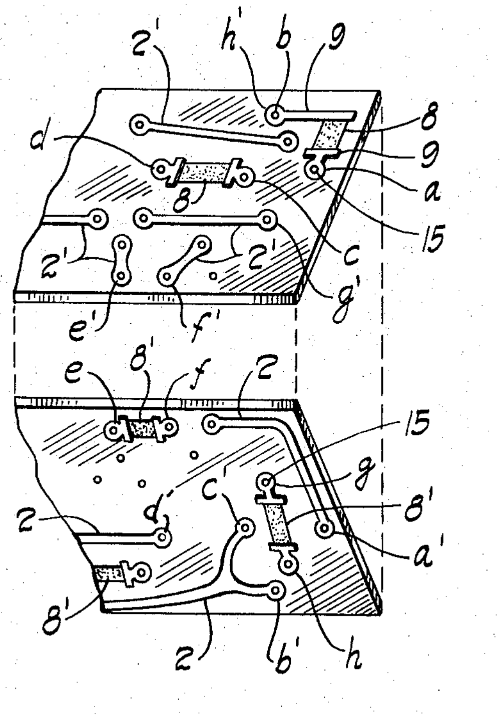
FIG. 6A is a fragmentary perspective view of the printed circuit formed in accordance with a third embodiment of this invention; and, FIG. 6B is a fragmentary perspective view showing the reverse side of the printed circuit shown in FIG. 6A.

Referring now to FIGS. 6A and 6B, there is shown a further embodiment of this invention. In this embodiment, the second side of the printed circuit board of FIGS. 1–4 on which the impedance layer 8 is applied has applied thereto copper layers 2' and the one side of the board on which the copper layers 2 are applied has applied thereto impedance layers 8' thereon to be connected to the copper layers 2'. In FIGS. 6A and 6B, the silver coatings *a–d* of the impedance layers 8 are respectively connected to the respective silver coatings *a'– d'* of the copper layers 2 by means of conductive coatings 15 which extend through the respective through holes. Similarly, the silver coatings *e – h* of the impedance layers 8' are respectively connected to the respective silver coatings *e'– h'* of the copper layers 2' by means of the conductive coatings 15, similar to conductive coatings 5, extending through the through holes.

While specific embodiments of the invention have been shown and described in detail it will be understood that the same are for illustration purpose only and are not to be taken as a definition of the invention and that various modifications and changes on the same will easily occur to those skilled in theart without departing from the scope of the invention as defined in the appended claims. For example, the sequence in which the base coating applying step and the through hole conductor applying step are carried out may be reversed and the sequence in which the through-hole conductor applying step, impedance element printing step and the connecting conductor coating step are carried out may be also varied in various ways. Conductive layers to be applied on the wall surfaces of the through holes may also be formed by electro-plating. Such modifications are also within the scope of the invention as claimed in the appended claims.

I claim;

1. An electrical resistor employing an insulating board comprising, in combnation, conductor layers on one side of the board, a plurality of through holes in the board in a plurality of conductor layers, impedance material on a second side of the board so as to form a layer of impedance material between two of said through holes, electrically conductive means in said two through holes interconnecting each end portion of said layer of impedance material with a conductor layer, and a conductive coating across one exposed end of each of said electrically conductive means and the mating end of each of said conductor layers.

2. An electrical resistor employing an insulating board comprising, in combination, conductor layers on one side of the board, a plurality of through holes in the board in a plurality of conductor layers, impedance material on a second side of the board so as to form a layer of impedance material between two of said through holes, electrically conductive means in said two through holes interconnecting each end portion of said layer of impedance material with a conductor layer, and a conductive coating across one exposed end of each of said electrically conductive means and the adjacent end of said layer of impedance material.

3. An electrical resistor employing an insulating board, comprising, in combination, conductor layers on one side of the board, a plurality of through holes in the board in a plurality of conductor layers, impedance material on a second side of the board so as to form a layer of impedance material between two of said through holes, electrically conductive means in said two through holes interconnecting each end portion of said layer of impedance material with a conductor layer, a conductive coating across one exposed end of said electrically conductive means and the adjacent end of said layer of impedance material, and an insulating coating over said layer of impedance material and electrically conductive means.

4. An electrical resistor employing an insulating board, comprising in combination, conductor layers on one side of the board, a plurality of through holes in the board in a plurality of conductor layers, impedance material on a second side of the board so as to form a layer of impedance material between two of said through holes, electrically conductive means in said two through holes interconnecting each end portion of said layer of impedance material with a conductor layer, a conductive coating across one exposed end of said electrically conductive means and the mating end of each of said conductor layers, and an insulating coating over said conductor layers and electrically conductive means.

5. A printed resistor employing a printed circuit board which comprises an insulating board;

copper layers applied on a first side of said board by etching and having predetermined patterns, impedance layers printed on a second side of said board at predetermined areas thereon, conductors applied in through holes in said board for electrically connecting between selected ones of said copper layers and said impedance layers, and printed conductive coatings applied across the opposite ends of said impedance layers and the adjacent ends of said connecting conductors.

6. A printed resistor employing a printed circuit board which comprises an insulating board;

copper layers applied on a first side of said board by etching and having predetermined patterns, impedance layers printed on a second side of said board at predetermined areas thereon, conductors applied in through holes in said board for electrically connecting between selected ones of said copper layers and said impedance layers, and printed conductive coatings applied across the ends of selected ones of said copper layers and the adjacent ends of said connecting conductors.

7. A printed resistor employing a printed circuit board which comprises an insulating board;

copper layers applied on a first side of said board by etching and having predetermined patterns, impedance layers printed on a second side of said board at predetermined areas thereon, conductors applied in through holes in said board for electrically connecting between selected ones of said copper layers and said impedance layers, and a printed insulating resin coating applied over the ends of selected ones of said copper layers and conductive coatings.

* * * * *